(12) United States Patent
Kazama et al.

(10) Patent No.: US 7,038,322 B2
(45) Date of Patent: May 2, 2006

(54) MULTI-CHIP MODULE

(75) Inventors: Atsushi Kazama, Chiyoda (JP); Akihiro Yaguchi, Iwama (JP); Hideo Miura, Koshigaya (JP); Asao Nishimura, Koganei (JP)

(73) Assignee: Hitachi, Ltd., Tokyo (JP)

( * ) Notice: Subject to any disclaimer, the term of this patent is extended or adjusted under 35 U.S.C. 154(b) by 46 days.

(21) Appl. No.: 10/919,331

(22) Filed: Aug. 17, 2004

(65) Prior Publication Data

US 2005/0029674 A1 Feb. 10, 2005

Related U.S. Application Data

(63) Continuation of application No. 10/700,470, filed on Nov. 5, 2003, now Pat. No. 6,777,816, which is a continuation of application No. 09/988,415, filed on Nov. 19, 2001, now Pat. No. 6,696,765.

(51) Int. Cl.
   *H01L 21/31* (2006.01)
(52) U.S. Cl. .............. 257/779; 257/669; 257/678; 257/700; 257/737; 257/747; 257/778; 257/783; 438/106; 438/121
(58) Field of Classification Search .............. None
   See application file for complete search history.

(56) References Cited

U.S. PATENT DOCUMENTS

| | | | |
|---|---|---|---|
| 4,983,023 A | 1/1991 | Nakagawa et al. | |
| 5,834,848 A * | 11/1998 | Iwasaki | 257/778 |
| 5,892,288 A | 4/1999 | Muraki et al. | |
| 6,037,662 A | 3/2000 | Yoon et al. | |
| 6,130,484 A | 10/2000 | Kameda et al. | |
| 6,216,937 B1 | 4/2001 | DeLaurentis et al. | |
| 6,274,821 B1 | 8/2001 | Echigo et al. | |
| 6,287,949 B1 | 9/2001 | Mori et al. | |
| 6,301,121 B1 | 10/2001 | Lin | |
| 6,313,532 B1 | 11/2001 | Shimoishizaka et al. | |
| 6,323,439 B1 | 11/2001 | Kambe et al. | |
| 6,396,145 B1 | 5/2002 | Nagai et al. | |

(Continued)

FOREIGN PATENT DOCUMENTS

JP 63-200415 8/1988

(Continued)

OTHER PUBLICATIONS

Partial English Translation of Official Action (mailed Oct. 29, 2002) for Patent Appln. No. 2000-333526, Date of Preparation of this Office Action—Oct. 21, 2002.

(Continued)

*Primary Examiner*—David Nelms
*Assistant Examiner*—Long Tran
(74) *Attorney, Agent, or Firm*—Antonelli, Terry, Stout and Kraus, LLP.

(57) ABSTRACT

A multi-chip module has at least two semiconductor chips. Each of the semiconductor chips has chip electrodes of the semiconductor chip, electrically conductive interconnections for electrically connection with the chip electrodes, electrically conductive lands for electrically connection with the interconnections, external terminals placed on the lands, and a stress-relaxation layer intervening between the lands and the semiconductor chip. The semiconductor chips are placed on a mounting board via the external terminals. The stress-relaxation layer of a first semiconductor chip is thicker than the stress-relaxation layer of a second semiconductor chip having a distance from a center thereof to an external terminal positioned at an outermost end portion thereof smaller than that of the first semiconductor chip.

9 Claims, 6 Drawing Sheets

U.S. PATENT DOCUMENTS

| | | |
|---|---|---|
| 6,425,516 B1 | 7/2002 | Iwatsu et al. |
| 6,465,881 B1 | 10/2002 | Tokunoh |
| 6,486,411 B1 | 11/2002 | Miura et al. |
| 6,576,505 B1 | 6/2003 | Borghs et al. |
| 6,710,446 B1 * | 3/2004 | Nagai et al. ............... 257/737 |

FOREIGN PATENT DOCUMENTS

| | | |
|---|---|---|
| JP | 8-274243 | 10/1996 |
| JP | 9 199635 | 7/1997 |
| JP | 9-219421 | 8/1997 |
| JP | 9-321084 | 12/1997 |
| JP | 10-92865 | 4/1998 |
| JP | A-10-126044 | 5/1998 |
| JP | 10-242333 | 9/1998 |
| JP | 11-008345 | 1/1999 |
| JP | 11-54649 | 2/1999 |
| JP | 11-111768 | 4/1999 |
| JP | 11-145345 | 5/1999 |
| JP | 11-147950 | 6/1999 |
| JP | 11-191571 | 7/1999 |
| JP | 11-191572 | 7/1999 |
| JP | 11-202362 | 7/1999 |
| JP | 11-204678 | 7/1999 |
| JP | 11-274155 | 10/1999 |
| JP | 11-274363 | 10/1999 |
| JP | 11-354560 | 12/1999 |
| JP | 2000-164761 | 6/2000 |
| JP | A-2000-196008 | 7/2000 |
| JP | 2001-118956 | 4/2001 |
| KR | 2001-51328 | 6/2001 |
| WO | WO96/09645 | 3/1996 |
| WO | WO98/25298 | 11/1998 |
| WO | WO99/23696 | 5/1999 |
| WO | WO00/52755 | 8/2000 |

OTHER PUBLICATIONS

Partial English Translation of Official Action (mailed Oct. 29, 2002) for Patent Appln. No. 2000-333528, Date of Preparation of this Office Action—Oct. 24, 2002.

Dictionary of Mounting Technology in Electronics, Jan. 20, 1992, p. 103.

U.S. Appl. No. 09/698,168—corresponds to Korea 2001-51328 above.

* cited by examiner

MULTI-CHIP MODULE

CROSS-REFERENCE TO RELATED APPLICATIONS

This application is a Continuation application of application Ser. No. 10/700,470, filed Nov. 5, 2003 now U.S. Pat. No. 6,777,816, which is a Continuation application of application Ser. No. 09/988,415, filed Nov. 19, 2001 now U.S. Pat. No. 6,696,765, the entire disclosures of which are hereby incorporated by reference.

BACKGROUND OF THE INVENTION

The present invention relates to a multi-chip module in which a plurality of semiconductor chips are mounted on a mounting board.

In recent years, mobile phones, note type computers, PDA (Personal Digital Assistance) or the like are rapidly coming into wide use, while miniaturization and weight reduction and higher performance of these consumer-oriented electronic systems are rapidly being pursued. In order to realize these, there is a need for a technology for densely packing semiconductor devices, such as a CPU, microprocessor, logic, and memory, and passive electronic components and assembling them into a system module.

Although an ultimate aspect of the system module is a system-on-chip in which all devices are made into a single chip, it is difficult to make different devices into a chip at the same time, and thus there is fear for a reduction in yield. Further, such a system module is made on orders for each of products and tends to be manufactured in small volumes with different configurations. Therefore, there is a problem that newly designing of such products from the stage of devices may be not cost-justified. Thus, the technology development of MCM (Multi-Chip Module) is actively pursued, in which a plurality of separately manufactured chips are densely mounted with wiring length as short as possible to assemble into one system module.

An example of conventional MCM's is described in JP-A-10-126044 specification, which discloses an MCM structure, wherein a plurality of semiconductor chips are flip-chip mounted on a base board via solder and a sealing resin is flowed between the semiconductor elements and the base board.

Further, JP-A-2000-196008 specification discloses a multi-chip type semiconductor device, in which semiconductor chips of not less than three are arranged on a board in a planar manner, electrical connections between the chips are made with fine lines, and the whole of the semiconductor chips and fine lines are covered with a sealing resin, and then a ball grid array which becomes as external electrodes is formed on a back surface of the board.

However, any of JP-A-10-126044 and JP-A-2000-196008 specification does not disclose how to improve the reliability of the whole multi-chip modules to thermal stress or the like.

Therefore, the invention has an object to provide a multi-chip module having high reliability to thermal stress or the like.

SUMMARY OF THE INVENTION

In order to overcome the above problems, the multi-chip module according to the invention will be structured as follows.

A first invention is for a multi-chip module in which a plurality of semiconductor chips having semiconductor elements are mounted on a mounting board. At least two of the semiconductor chips have chip electrodes, electrically conductive interconnections for electrically connection with the chip electrodes, electrically conductive lands for electrically connection with the interconnections, external terminals placed on the lands, and stress-relaxation layers intervening between the lands and the semiconductor chips. The semiconductor chips are mounted on the mounting board via the external terminals. The stress-relaxation layer of a first semiconductor chip is thicker than the stress-relaxation layer of a second semiconductor chip having a distance from a center thereof to an external terminal positioned at an outermost end portion thereof smaller than that of the first semiconductor chip.

When improving the reliability of the multi-chip module of the present invention, in order that the reliability of a plurality of stress-relaxation layered semiconductor chips mounted therein can be matched with the improved reliability of the multi-chip module, the chip having a larger outermost terminal distance should have a stress-relaxation layer able to absorb larger strain. As the material of the stress-relaxation layer is smaller in elasticity and thicker in thickness, the stress-relaxation layer has a higher ability to absorb strain. When the materials of the stress-relaxation layers are of the same degree, the stress-relaxation layer of the chip having a larger outermost terminal distance is made thick, such that a difference in the reliability of their external terminals can be made smaller.

A plurality of stress-relaxation layered semiconductor chips mounted on a mounting board are a small package of the chip size in which the external terminals are placed within a plane of the semiconductor chip or in a range close thereto. When temperature changes are applied to the state where the semiconductor chips are mounted on a board, strains are caused by a difference in thermal expansion between the semiconductor chips and the mounting board. Although these strains tend to concentrate on the external terminals sandwiched therebetween, it is possible to absorb the strains by deformation of the stress-relaxation layers intervening between the external terminals and the semiconductor chips to improve the life of the external terminals in temperature cycles. The reliability of the external terminals can be improved without the reinforcement of under-fills, which has been used in multi-chip modules based on conventional bare chip mountings. Therefore, the under-fill process can be omitted in mounting, thus resulting in low cost. Further, the chips are repairable after mounting. In this case, it is desirable from the viewpoints of effective cooling that there are spaces around the external terminals. Also, because the interconnections are on a chip and the external terminals are arranged at a pitch larger than the pitch of chip electrodes, the chips is easy to be mounted on a board and also high-density mounting boards are not needed. Further, because the stress-relaxation layer can absorb a displacement difference caused by the thermal expansion, the stress generated in the chips can be reduced. Further, the cracks in chips can be suppressed. These can provide multi-chip modules of high reliability at low cost. Also, the multi-chip modules are easy to be mounted on a board and able to suppress cracks in chips.

Further, it is preferable to form a multi-chip module, in which at least two of the semiconductor chips have chip electrodes of the semiconductor chips, electrically conductive interconnections for electrically connection with the chip electrodes, electrically conductive lands for electrically connection with the interconnections, external terminals placed on the lands, and stress-relaxation layers intervening between the lands and the semiconductor chips, and are placed on the mounting board via the external terminals, and spaces are provided around the external terminals, and a distance between an end of a first semiconductor chip having the stress-relaxation layer and an end of a second semiconductor chip having the stress-relaxation layer placed adjacent to the first semiconductor chip is less than 1 mm.

In the under-fill mounting, the under-fill is formed so as to spread from ends of the semiconductor chip outward to the surface of the mounting board (under-fill fillet). Also, in order to insert a nozzle for injecting under-fill, a space of 1 to 2 mm is required between adjacently mounted semiconductor chips. On the other hand, when the under-fills are omitted in semiconductor chips having stress-relaxation layers in the multi-chip module of the invention, the multi-chip module can be formed in the same size as the semiconductor chips, and thus a plurality of semiconductor chips can be mounted more densely. In this case, effective cooling is possible in spite of high-density mounting. For example, the space between the adjacent semiconductor chips may be less than 1 mm or 0-0.5 mm or less than 0.5 mm to increase the mounting density. Further, the space can be narrowed to the extent such that the ends of both chips will not come into contact with each other.

Also, a second invention provides a multi-chip module comprising a plurality of semiconductor chips having the stress-relaxation layers, characterized in that the stress-relaxation layer of a first semiconductor chip is thicker than the stress-relaxation layer of a second semiconductor chip having a projected area of the external terminal positioned at the outermost end larger than that projected area of the first semiconductor chip.

The life of an external terminal changes depending on the size of the external terminal. The larger the size of an external terminal is, the larger the strain absorbed by the external terminal itself is, thus improving the reliability of the external terminal. Therefore, when the pitch of external terminals arranged is small and the size of the external terminals is also small, as described above, the thickness of the stress-relaxation layers is made so thick as to reduce a disparity in the stress-absorbing ability as a whole, thereby allowing an improvement in the whole reliability.

However, when merit of a reduction in cost due to unification of processes is larger, the thickness of the stress-relaxation layer necessary for ensuring the reliability of a stress-relaxation layered semiconductor device of the largest outermost-terminal-distance may be also formed as the thickness of the stress-relaxation layer of the other stress-relaxation layered semiconductor devices.

Further, for the above described multi-chip module, it is preferable that in at least one of stress-relaxation layered semiconductor devices, the interconnections, the lands, the external terminals, and the end of the stress-relaxation layer are formed inside the end of the semiconductor chip. In this case, it is preferable that the interconnections are formed with thin film interconnections, for example.

Although Si has been conventionally mainstream as a material of semiconductor chips, in recent years, compound semiconductors such as GaAs and InP has been being used for high speed signal processing and optical signal processing in communication system. These compound semiconductors are generally more brittle than Si, and thus the above problem of cracks in chips may be noticeable. In the multi-chip module according to the invention, the stress-relaxation layered semiconductor device is applied to semiconductor chips made of the compound semiconductors as described above, thereby allowing a reduction in the stresses applied to the semiconductor chips and the prevention of cracks in chips.

DETAILED DESCRIPTION OF THE INVENTION

The invention is adaptable to a multi-chip module having a plurality of semiconductor devices and passive electronic components densely mounted on a board, and performing a function operable as one system. As such semiconductor devices to be mounted on the mounting board, for example, a CPU, microprocessor, logic, memory (DRAM, SRAM, Flash, etc.), or image-processing-dedicated chip, and a specific chip integrating interfaces or the like into a single chip, are variously considered depending on products. The passive components are chip-capacitors and/or resistors, which are assembled for stabilization of the circuit, such as for reducing noise. The components may be mounted inside of the mounting board.

Figure 1:
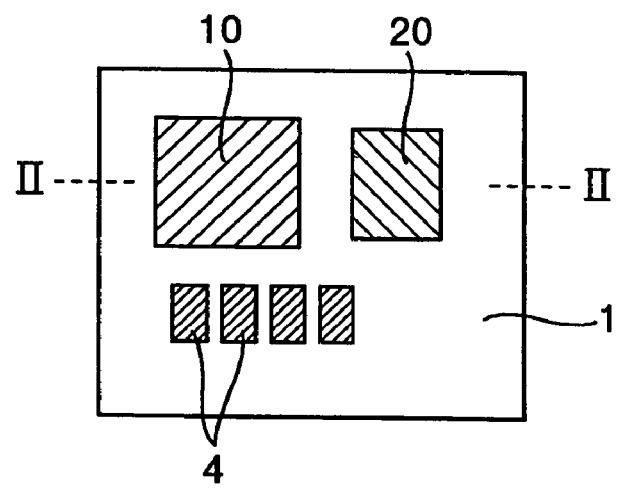
FIG. 1 is a plan schematic diagram of a multi-chip module according to a first embodiment of the present invention.
Figure 2:
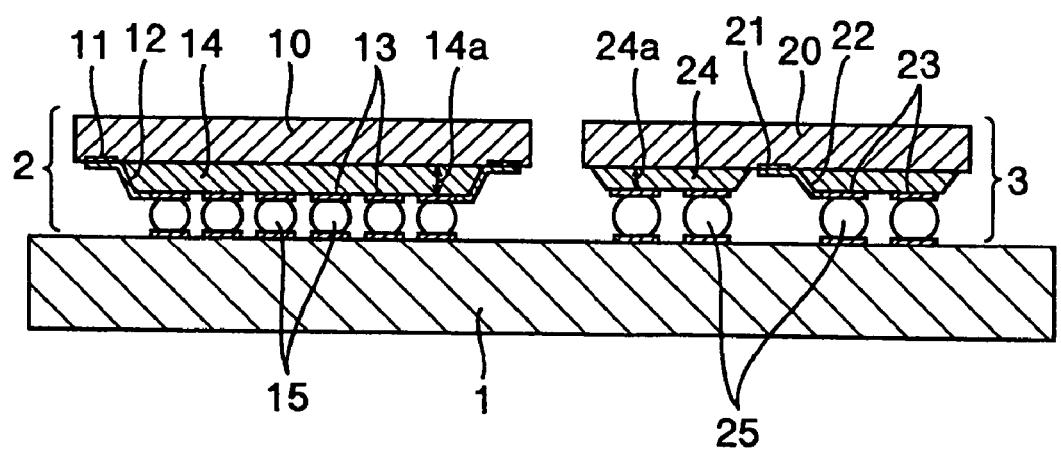
FIG. 2 is a schematic cross sectional view of the multi-chip module according to the first embodiment of the present invention.

FIGS. 1 and 2 are a plan view and a cross-sectional view of a first embodiment of the invention. As shown in FIG. 1, the first embodiment of the invention provides an example of a basic configuration, in which two semiconductor devices of a first semiconductor chip 10 and a second semiconductor chip 20, and four passive components 4 are mounted on a mounting board 1.

FIG. 2 shows a cross-sectional view of a cross section (cross section along a line II—II in FIG. 1) including the first semiconductor chip 10 and the second semiconductor chip 20. As shown in FIG. 2, on a surface of the first semiconductor chip 10, formed are chip electrodes 11, conductive interconnections 12 extending from the chip electrodes 11, conductive lands 13 connecting to the interconnections 12, a stress-relaxation layer 14 intervening at least between the semiconductor chip 10 and the lands 13, and external terminals 15 joined to the lands 13. A first stress-relaxation layered semiconductor device 2 is mounted on a mounting board 1 via the external terminals 15. Similarly, the second semiconductor chip 20 also has chip electrodes 21, conductive interconnections 22, conductive lands 23, a stress-relaxation layer 24, and external terminals 25. A second stress-relaxation layered semiconductor device 3 is mounted on the mounting board 1 via the external terminals 25.

As the external terminals 15 and 25, solder materials (Pb—Sn eutectic solder, Sn—Ag based solder, Sn—Ag—Cu—Bi based solder, etc.) are used, for example, and they are shaped like balls.

In the multi-chip module of the present invention, both of the first semiconductor chip 10 and the second semiconductor chip 20 have respective stress-relaxation layers 14 and 24 intervening between the respective chips and the mounting board 1. Therefore, the strains caused by a thermal expansion difference between the semiconductor chips and the mounting board can be absorbed by deformation of the stress-relaxation layers, and thus the strains generated at solder bumps of the external terminals are reduced, thereby improving the life of the solder bumps in temperature cycling.

In the case of the bare-chip mounting of semiconductor chips, that is, when chips are mounted on a board via the external terminals formed directly on the chip electrodes, the external terminals become early fatigued due to the strains caused by the above-described thermal expansion difference between the semiconductor chips and the mounting board. From this reason, a resin called an under-fill is injected between the semiconductor chips and the mounting board so as to provide reinforcements around the external terminals, thereby ensuring the reliability of the external terminals. However, the under-fill has problems that material cost is expensive, time is consumed in injection process, and know-how concerning a highly reliable injection method for avoiding voids or the like is needed.

In the multi-chip module of the invention, on account of the deformation of the stress-relaxation layer, the reliability of external terminals is ensured. In addition to this, when omitting the reinforcement by the under-fill resin, it is possible to further lower the cost. The multi-chip module of the invention is considered to increase cooling effectiveness. Further, because of the mounting by solder bumps, the chips can be easily removed by thermally melting the solder. As a result, the replacement of defective chips is easier than the mounting with use of under-fills.

Further, in the conventional bare-chip mounting, the chips are mounted on a board via the external terminals, which are formed on the chip electrodes arranged at narrow pitch (generally, about a little less than 100 μm). Therefore, considerably high accuracy of alignment is required in mounting the chip on the board. On the other hand, in the stress-relaxation layered semiconductor device according to the invention, the pitch is increased by interconnections extending from the chip electrodes. Thus, such high accuracy of alignment may be made unnecessary.

As described above, the multi-chip module of the invention has an increased pitch of the external terminals as compared with multi-chip modules based on the conventional bare-chip mounting, and does not require under-fills. Therefore, the multi-chip module of the invention is characterized in that the mounting of a semiconductor chip on a mounting board is easy, and that repairing after the mounting is possible. Further, it is characterized in that the increased pitch of the external terminals makes it possible to increase also the pitch of the lands on the side of the mounting board, which lands are used for joining the external terminals, thus permitting low cost boards.

Also, Si is mainly a main material of the semiconductor chips to be mounted. However, compound semiconductor such as GaAs and InP may be used for the chips for processing high frequency signals, which are used for portable telephones or the like. In the stress-relaxation layered semiconductor device according to the invention, both the external terminals and the stress-relaxation layer can absorb thermal strain, and thus the stress generated in the semiconductor chip can be reduced to a very small amount. Therefore, it is desirable that the semiconductor chips using more brittle materials than Si are assembled as stress-relaxation layered semiconductor devices and are mounted on a mounting board thereof.

Further, in the under-fill mounting, the under-fill is formed so as to spread from ends of the semiconductor chip outward to the surface of the mounting board (under-fill fillet). Also, in order to insert a nozzle for injecting under-fill, a space of 1 to 2 mm is required between adjacently mounted semiconductor chips. On the other hand, the stress-relaxation layered semiconductor device in the multi-chip module according to the invention can be formed in the same size as the semiconductor chip, and a plurality of semiconductor chips can be also mounted more densely by omitting the under-fill mounting. For example, a space between the ends of adjacent stress-relaxation layered semiconductor chips can be set to a distance less than 1 mm, for example, equal to or less than 0.5 mm.

Smaller in elastic modulus and thicker in thickness the stress-relaxation layer is, the higher the ability of absorbing strains is, thus improving the reliability of the external terminals.

In order to satisfy the reliability level demanded to multi-chip modules, the reliability of the external terminals in all semiconductor devices to be mounted should be higher than that reliability level. However, the specifications of the stress-relaxation layer required to satisfy this reliability level are different among a plurality of different semiconductor chips.

Consider a stress-relaxation layered semiconductor device that includes a plurality of different semiconductor chips having the stress-relaxation layers made of the same material and in the same thickness. In the semiconductor device having the plurality of semiconductor chips, the lives of the external terminals are different. This is because a deformation difference between a semiconductor chip and the mounting board caused by thermal expansion is larger at a farther position from a center of the semiconductor chip, such that the farther position from the center of the semiconductor chip the external terminal located at, the larger the strain is generated. The distance from the center of the chip to the external terminal located at the outermost position is hereinafter referred to as an outermost terminal distance.

If the outermost terminal distance of the stress-relaxation layered first semiconductor device 2 is larger than that of a stress-relaxation layered second semiconductor device 3, in order to realize the same reliability of the external terminals in both devices, the absorption of strain by the stress-relaxation layer of the first semiconductor device 2 is made larger. If the materials of the stress-relaxation layers are similar in both devices, the thickness 14a of the stress-relaxation layer 14 of the first semiconductor device 2 is made thicker than the thickness 24a of the stress-relaxation layer 24 of the second semiconductor device 3. This is because a thicker stress-relaxation layer can have the larger ability to absorb strain. By the way, by comparing the distances between the farthest external terminals of both chips instead of the outermost terminal distance, the stress-relaxation layer thickness of the chip having the longer distance may be made thicker than that of the chip having the smaller distance.

The lives of the external terminals change depending on the size thereof. The larger the size of an external terminal is, the larger the strain absorption by the external terminal itself is, thus increasing the reliability of the external terminal. Therefore, if the stress-relaxation layered second semiconductor device 3 has a small arrangement pitch of the external terminals and the size of the external terminals thereof is smaller than that of the first stress-relaxation layered semiconductor device 2, the stress-relaxation layer thickness of the second semiconductor device 3 is made thicker than that of the first semiconductor device 2.

Also, by comparing the diameters of lands (for example, diameter of the land for the outermost terminal) instead of the size of the external terminal, the stress-relaxation layer thickness of the semiconductor device having a smaller diameter may be made thicker.

Further, as an example, in the case where the stress-relaxation layered second semiconductor device 3 has the smaller outermost terminal distance, and when the sizes of the external terminals thereof must be made smaller because the arrangement pitch of the external terminals thereof is small, unless the thickness of the stress-relaxation layer of the second semiconductor device 3 is made thicker than that of the first semiconductor device 2 having a larger outermost terminal distance, it may be impossible to ensure the reliability. In such a case, the thickness of the stress-relaxation layer of the second semiconductor device 3 having a smaller size of external terminals may be made thicker.

As the thickness of the stress-relaxation layer is made thicker, the reliability of the external terminal is increased. On the other hand, however, the thicker the stress-relaxation layer is, the higher the material cost of the stress-relaxation layer is. Further, when interconnections for connecting the chip electrodes and the lands on the stress-relaxation layer are formed by a thin film wiring process, a thicker stress-relaxation layer may make the exposure and development of a photo-resist difficult. Therefore, the stress-relaxation layer is controlled to such a thickness as able to ensure the reliability of a required level for the two semiconductor devices, and should not be made thicker than this thickness, thereby resulting in the most useful structure.

Also, when merit of a reduction in cost due to unification of the processes is larger, both of the stress-relaxation layers may be formed in the same thickness.

Also, in a stress-relaxation layered semiconductor device having a small number of external terminals, if a forming process that forming of interconnections does not become so difficult even when the stress-relaxation layer is thick is used (for example, connection by leads or wires), it is easy to form the stress-relaxation layer.

Therefore, depending on the conditions, it is possible to provide a thick stress-relaxation layer with a stress-relaxation layered semiconductor device having a small number of external terminals.

As the materials of the stress-relaxation layer, there are polyimide resin, polyetherimide resin, polyimideamide resin, acrylic modified epoxy resin, rubber-composed epoxy resin, and silicone resin, and it is desirable that a modulus of longitudinal elasticity at room temperature is low elasticity to a degree nearly equal to or less than 2000 MPa, in order to obtain the effective absorbing of strain. Then, it is desirable to ensure a modulus of elasticity nearly equal to and more than 100 MPa. Practically, it is possible to use the materials having a modulus of elasticity in the range equal to and more than 500 and equal to and less than 1000 MPa.

Figure 3:
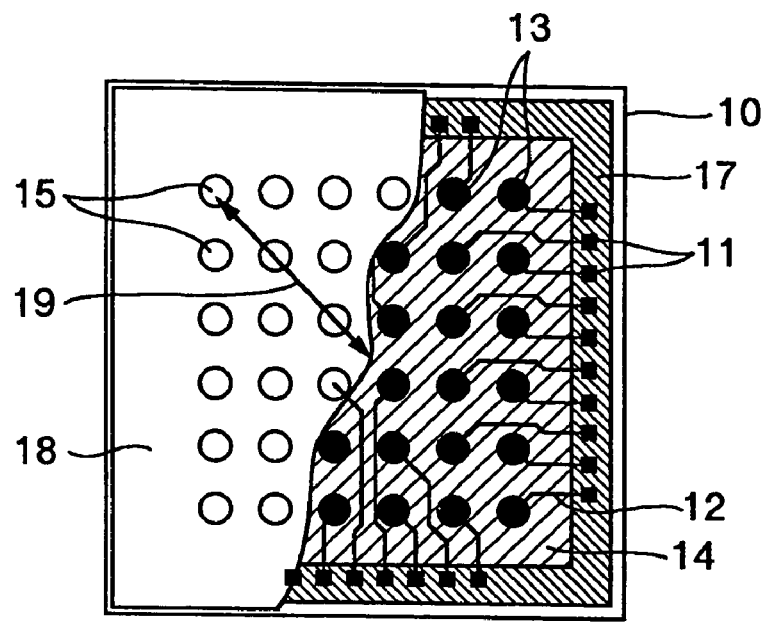
FIG. 3 is a schematic plan view showing a detailed structure of a first stress-relaxation layered semiconductor device included in the first embodiment according to the present invention.

In the configuration of the stress-relaxation layered semiconductor device shown in the cross sectional view of FIG. 2, only components necessary for describing the main advantages of the invention are illustrated, and detailed configurations are omitted. An example of the detailed configuration of the first stress-relaxation layered semiconductor device 2 according to the first embodiment is shown in the plan view of FIG. 3 and in the cross sectional view of FIG. 4. FIG. 3 shows a view of the state where parts of the external terminals and surface passivation layer are removed such that the internal structure may be seen.

Figure 4:
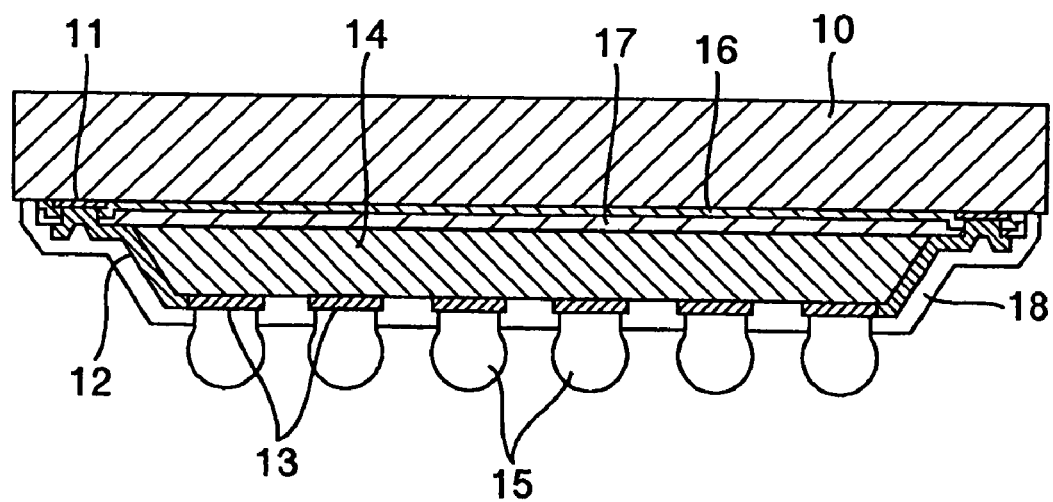
FIG. 4 is a schematic cross sectional view showing the detailed structure of the first stress-relaxation layered semiconductor device, included in the first embodiment according to the present invention.

As shown in FIG. 3, in the first semiconductor chip 10, the chip electrodes 11 are placed on the four sides of the periphery thereof, and the interconnections 12 extend toward the central portion, and the lands 13 to be joined to the external terminals 15 are arranged at a larger pitch than that of the chip electrodes 11. For example, when the number of external terminals is as large as several hundreds, as in a microcomputer chip, the chip electrodes are often placed in the peripheral portion. The cross sectional view is shown in FIG. 4. The stress-relaxation layer 14 intervenes at least between the lands 13 and the first semiconductor chip 10 to absorb thermal strain, thereby improving the reliability of the external terminals.

Hereinafter, the structural components omitted in FIG. 2 will be described. A passivation layer 16 is formed so as to cover a plane of the semiconductor chip 10 on which the chip electrodes 11 are formed. This film is very thin, and can be formed in the wafer process in order to protect the surface of the semiconductor chip.

An insulating layer 17 may be formed so as to intervene between the passivation layer 16 and the stress-relaxation layer 14. In the stress-relaxation layered semiconductor device 2, there is a thick stress-relaxation layer 14 intervening between the interconnections 12 and the internal interconnections of the semiconductor chip 10. Therefore, there is feature that electric capacitance between them can be reduced and malfunctions by cross talk noise hard to occur. However, since the interconnections 12 are formed directly on the thin passivation layer 16 around the chip electrodes 11, there is a case that the electric capacitance of these regions may become a problem when high-speed operation is required. The electric capacitance of these regions can be greatly reduced by forming the insulating layer 17 so as to intervene between the interconnections 12 and the semiconductor chip 10 around the chip electrodes 11.

Further, for the purpose of mainly protecting the interconnections, a surface passivation layer 18 is formed on a top surface of the stress-relaxation layered semiconductor device 2. The surface passivation layer 18 is formed with openings above the lands 13 for joining the lands 13 and the external terminals 15.

Also, as shown in FIG. 3, the outermost terminal distance 19 described above corresponds to the distance from the center in the plane of the semiconductor chip 10 to an external terminal located at the farthest position.

Figure 5:
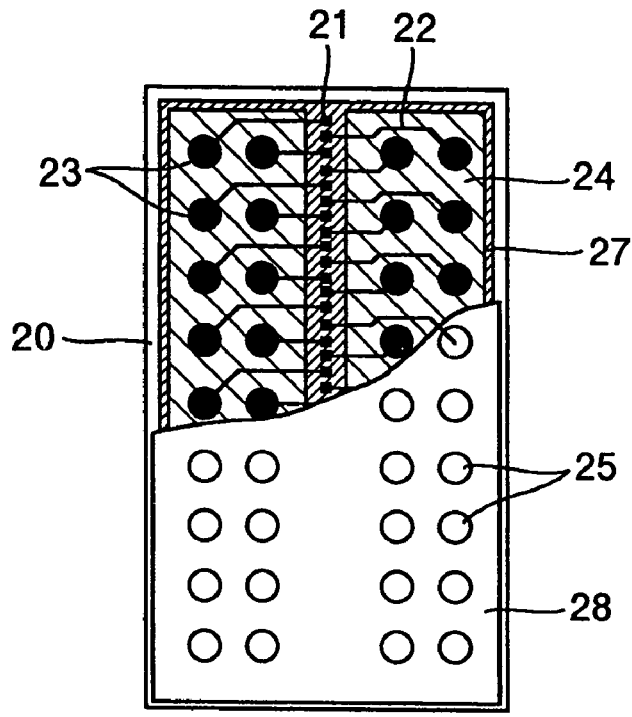
FIG. 5 is a schematic plan view showing the detailed structure of a second stress-relaxation layered semiconductor device included in the first embodiment according to the present invention.
Figure 6:
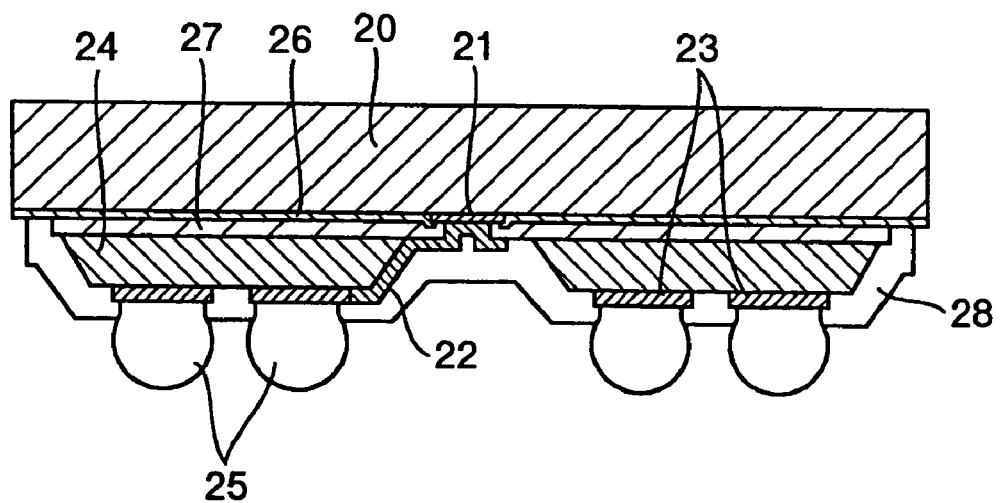
FIG. 6 is a schematic cross sectional view showing the detailed structure of the second stress-relaxation layered semiconductor device included in the first embodiment according to the present invention.

An example of the detailed configuration of the second stress-relaxation layered semiconductor device 3 according to the first embodiment is shown in the plan view in FIG. 5 and in the cross sectional view in FIG. 6. FIG. 5 shows a view of the state where parts of the external terminals and the surface passivation layer are removed such that the internal structure may be seen.

The basic configuration thereof is the same as the stress-relaxation layered semiconductor device 2, except that the chip electrodes 21 are arranged at the central portion of the semiconductor chip 20. When the number of external terminals is as relatively small as several tens, as shown in memory products, the chip electrodes may be arranged at the central portion, as in this example. As shown in FIG. 5, interconnections 22 extend from the chip electrodes 21 in the center to the peripheral portion, and the lands 23 to be jointed with the external electrodes 25 are arranged at a pitch larger than the pitch of the chip electrodes 21. The structural components omitted in FIG. 2 are also the same as the first stress-relaxation layered semiconductor device. The passivation layer 16 is formed over the surface of the semiconductor chip 20 and the surface passivation layer 18 is formed over the top of the semiconductor device. Also, the insulating layer 17 may be formed to intervene between the passivation layer 16 and the stress-relaxation layer 14.

Figure 7:
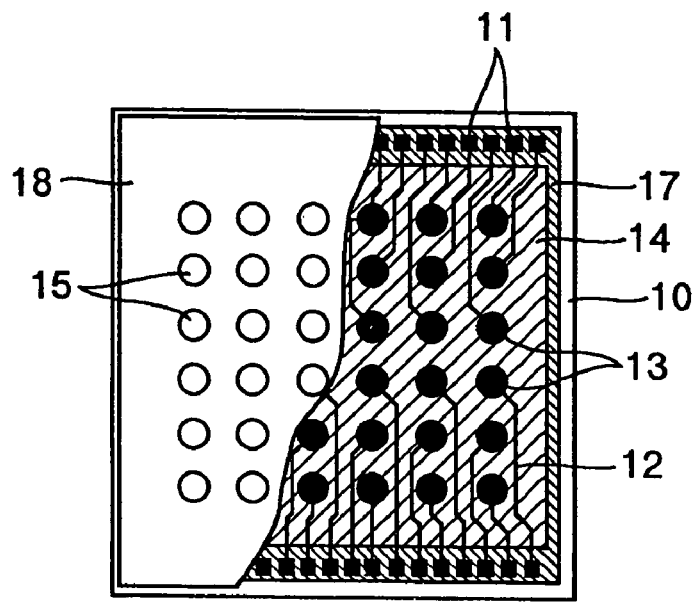
FIG. 7 is a schematic plan view showing the detailed structure of a stress-relaxation layered semiconductor device in which chip electrodes are arranged on two sides of a periphery portion.

The arrangement of the chip electrodes is not limited to the peripheral arrangement of four sides as shown in FIG. 3 and the central arrangement of a single line as shown in FIG. 5. However, the chip electrodes may be arranged on the two sides of the chip periphery as shown in the plan view of FIG. 7, for example. Further, various arrangements of chip electrodes may be considered, including the arrangement of both the periphery and the center and the arrangement of lines of not less than two. Stress-relaxation layered semiconductor devices having chip electrodes arranged in such various arrangements may be used for the first stress-relaxation layered semiconductor device or the second stress-relaxation layered semiconductor device. The arrangement of the external terminals is also not limited to the arrangement shown in the present embodiment.

Also, in the stress-relaxation layered semiconductor devices illustrated in FIGS. 3 to 7, all the structural components are formed within the surface of the semiconductor chips, so that they can be manufactured in a wafer level. That is, in the conventional semiconductor device manufacturing processes, a large number of semiconductor chips are formed on a wafer and a passivation layer is formed, and thereafter individual chips are cut out by dicing. Then, semiconductor device manufacturing processes such as the formation of wiring and external terminals or the like are performed individually for each semiconductor chip. However, the present stress-relaxation layered semiconductor devices can be adapted to a method of manufacturing in a wafer level, in which the stress-relaxation layer, interconnections or the like are formed and then the external terminals are formed still in the state of a wafer, and thereafter, individual semiconductor devices are separated by dicing. Thereby, a significant reduction in the cost of manufacturing is possible, as compared with the case of assembling operations for semiconductor device performed individually for each semiconductor chip. Further, when manufactured in a wafer level, it is desirable to form the stress-relaxation layers by means of a printing method using a screen mask. Thereby, the stress-relaxation layers can be collectively manufactured on a single wafer and further can be easily formed except the area above the chip electrodes. Also, as the interconnections and the lands are collectively formed on a single wafer, it is desirable to use a thin film interconnection forming process using sputtering, plating and the like.

When the method of manufacturing in a wafer level is used, as the number of the semiconductor devices per wafer increases, the manufacturing cost thereof can decrease. However, when the acceptable semiconductor chips per wafer are not so many because of the large size and the low yield of the semiconductor chips, the individual manufacturing for each semiconductor chip may be at low cost.

Figure 8:
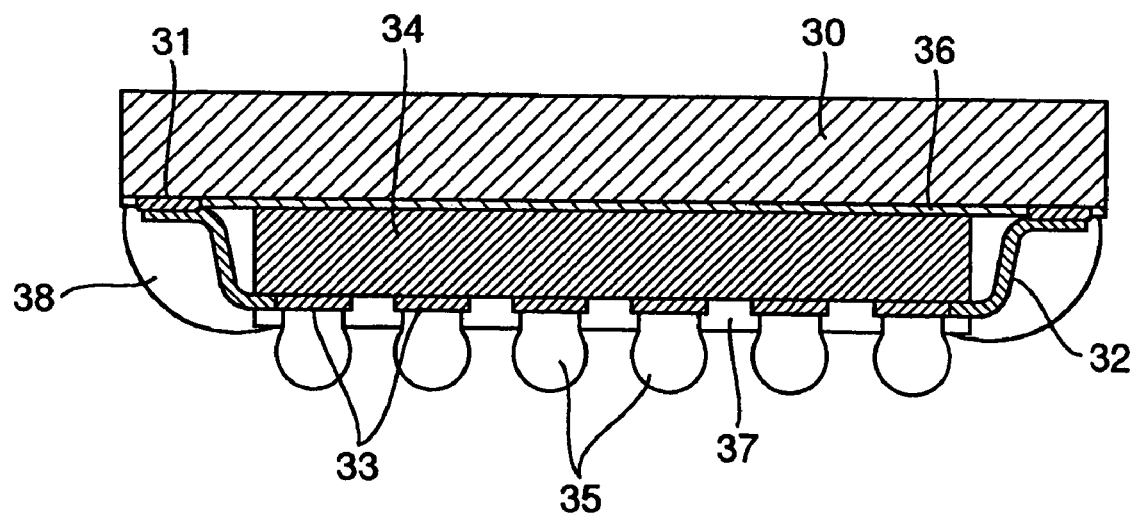
FIG. 8 is a schematic cross sectional view of a stress-relaxation layered semiconductor device (chip electrodes being placed in periphery portion), which is individually manufactured for each semiconductor chip.
Figure 9:
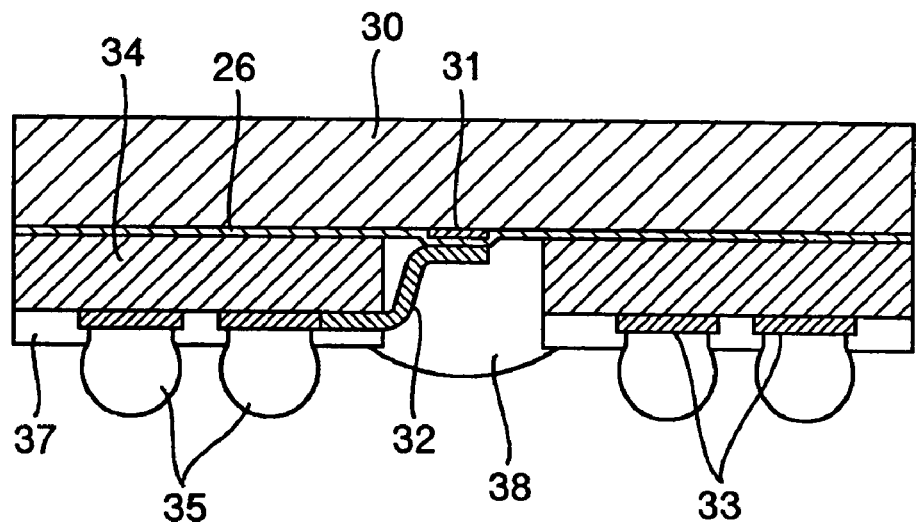
FIG. 9 is a schematic cross sectional view of a stress-relaxation layered semiconductor device (chip electrodes being placed in a central portion), which is individually manufactured for each semiconductor chip.

Examples of the configuration of the stress-relaxation layered semiconductor device that is assumed to be individually manufactured for each chip are shown in the cross sectional views of FIGS. 8 and 9. FIG. 8 shows the case where chip electrodes 31 are placed on the peripheral portion of a semiconductor chip 30. A stress-relaxation layer 34 is formed on a passivation layer 36 formed over a surface of the semiconductor chip 30, except upper areas of chip electrodes 32. Further, a tape-like element 37 provided with interconnections 32 and lands 33 is bonded thereon. The interconnections 32 have lead portions protruding partially from the tape-like element 37 and ends of these lead portions are connected with the chip electrodes 31 to establish electrical connections. Then, the lead portions of the interconnections 32 and the joint portions of the chip electrodes 31 are sealed with a sealing resin 38.

Also in the present configuration, it is possible to absorb thermal stress by the stress-relaxation layer 34 to improve the reliability of the external terminals. Further, also in the case in which the stress-relaxation layered semiconductor device of the present configuration is applied to either or both of the first and second stress-relaxation layered semiconductor device in the multi-chip module according to the above-described first embodiment, the stress-relaxation layer of the stress-relaxation layered semiconductor device having a larger outermost terminal distance or smaller external terminals is made thicker than or comparable to the other devices in order to satisfy the reliability of the multi-chip module. However, in the stress-relaxation layered semiconductor device of the present configuration, connections between the interconnections on the stress-relaxation layer and the chip electrodes are formed by lead wires. Therefore, in the present configuration, even if the stress-relaxation layer is thick, the forming of wiring is not so difficult, as compared with the configurations of FIGS. 3–7, in which the connections are formed with thin film interconnections. Therefore, when the present configuration is applied to the second stress-relaxation layered semiconductor device, if merits of easy formation of stress-relaxation layer and use of existing equipment or the like are larger than merits of reduction in material cost due to thin stress-relaxation layers, the stress-relaxation layer can be formed thick, with the knowledge of the reliability of over-specification.

FIG. 9 shows nearly the same configuration as FIG. 8, but shows an example of the structure in which chip electrodes 31 are arranged in the central portion of the semiconductor chip 30. The configuration of FIG. 9 is the same as the configuration of FIG. 8, except that interconnections 32 extend from the chip electrode 31 in the center of the chip to the periphery portion thereof. Further, in the present configuration, manufacturing is individually effected for each chip, and therefore, the stress-relaxation layer 34 and the tape-like element 37 may be protruded from the end of the semiconductor chip 30. In such case, the external terminals also may be formed outside the ends of the semiconductor chip.

Figure 10:
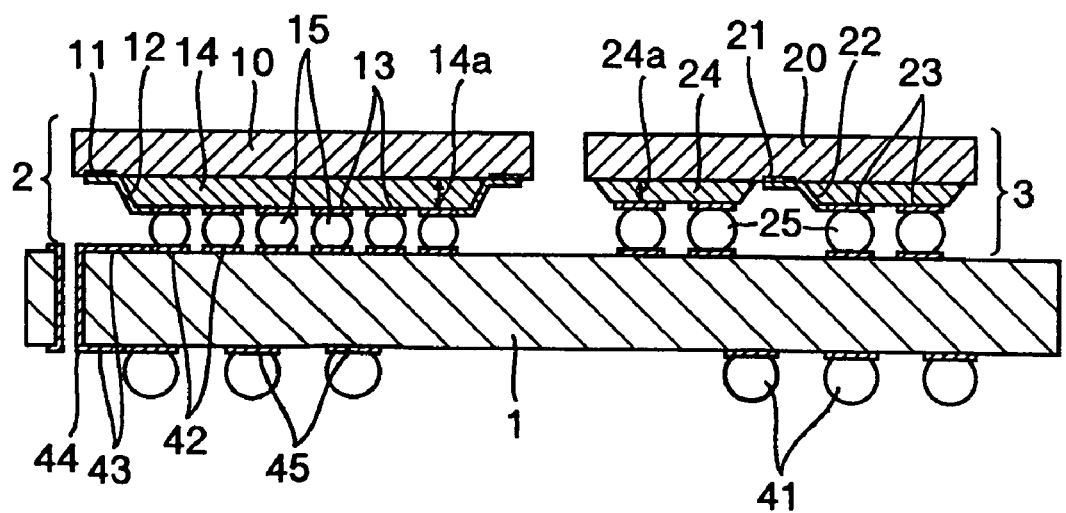
FIG. 10 is a schematic, cross sectional view of a multi-chip module in which external terminals are formed on a back surface of a mounting board according to the invention.

As shown in FIG. 2, in the multi-chip module of the invention, a plurality of semiconductor chips and passive electronic parts are densely mounted on a board, and the multi-chip module of the invention is a module having function of operation as one system. This module is secondarily mounted on a motherboard via external terminals 41 such as solder balls or the like, for example, as shown in the cross sectional view of FIG. 10. The mounting board 1 has multi-layered wiring layers of which the electrical connections extend from lands 42 on a semiconductor chip-mounting surface of the board 1 to the lands 45 on a back surface thereof through interconnections 43 and through holes 44. The external terminals 41 are provided via lands 45 on the back surface. The module is mounted on the motherboard via these external terminals 41. FIG. 10 shows an example of a mounting board having the through hole 41 passing through the board, but interconnections may extend to the back surface via a plurality of through holes not passing through the board.

Further, because the multi-chip module of the invention is mounted on a mounting board after the pitch of the external terminals has been increased, it does not require any exclusive board having lands densely arranged thereon, not like multi-chip modules manufactured by conventional bare-chip mounting. Thus, the stress-relaxation layered semiconductor devices and passive electronic parts may be mounted directly on a motherboard. That is, the mounting board 1 shown in FIG. 2 is part of a motherboard, and thus part of the motherboard having the above-described electronic parts densely mounted may be considered as a multi-chip module performing function as one system.

In the multi-chip module of the invention, semiconductor chips mounted thereon may be equal to and more than three chips. At least two of the chips have the stress-relaxation layered semiconductor devices as shown in FIGS. 3 to 9, and are joined to the mounting board.

When a certain level of reliability is demanded to a multi-chip module, among a plurality of stress-relaxation layered semiconductor devices mounted thereon, the stress-relaxation layer of the device having a larger outmost terminal distance is made thicker to establish the same degree of reliability among the plurality of stress-relaxation layered semiconductor devices. This is preferable from the view points of reduction of material cost of the stress-relaxation layers or the like. However, when merit of cost reduction due to unification of the processes is larger, a stress-relaxation layer of a semiconductor device having a small outermost terminal distance may be formed as the stress-relaxation layer of the same thickness as a device having a large outermost terminal distance.

Further, a stress-relaxation layer of a stress-relaxation layered semiconductor device having a smaller size of external terminals than other stress-relaxation layered semiconductor devices may be made thicker than those of the other stress-relaxation layered semiconductor devices having a larger outermost terminal distance, thus ensuring the entire reliability. When the size of external terminals affects more significantly on the life of the external terminals than the outermost terminal distance, the stress-relaxation layer of the stress-relaxation layered semiconductor device having a smaller size of the external terminals is made thicker, thereby ensuring the entire reliability.

Also, when there are mounted the stress-relaxation layered semiconductor devices in which the wiring connections are made by lead lines as shown in FIGS. 8 and 9, wiring formation does not become so difficult even if the stress-relaxation layer becomes thick, as compared with devices having the wiring of thin films. Therefore, when merits of easy formation of stress-relaxation layers and use of existing equipment or the like are larger than merits of a reduction in material cost by making stress-relaxation layers thin, the stress-relaxation layer thereof can be made thicker than the stress-relaxation layered semiconductor device having the largest outermost terminal distance, with the knowledge of the reliability of over-specification.

Figure 11:
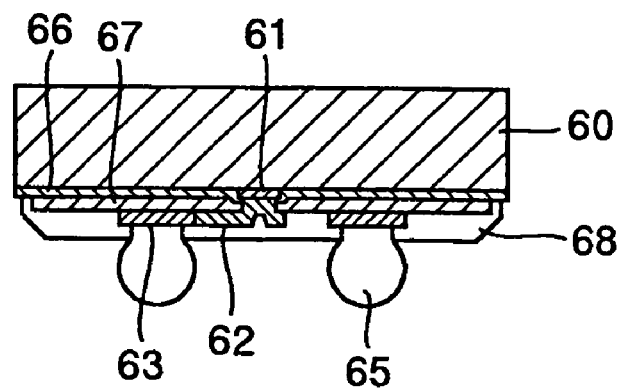
FIG. 11 is a schematic cross sectional view of a semiconductor device without stress-relaxation layer.

Further, a semiconductor chip not having a form of a stress-relaxation layered semiconductor device may be mounted in the multi-chip module of the invention. For example, when the outermost terminal distance is relatively small and the size of external terminals is relatively large, there is a case in which the reliability of external terminals can be ensured without any absorption of strain by a stress-relaxation layer. In such a case, the configuration not having a stress-relaxation layer may be used, as shown in a cross sectional view of FIG. 11. In this case, it is desirable to form an insulating layer 67 between the wiring 62 and the passivation layer 66 so as to reduce the electric capacitance between the wiring 62 and the internal wiring in the semiconductor chip.

Figure 12:
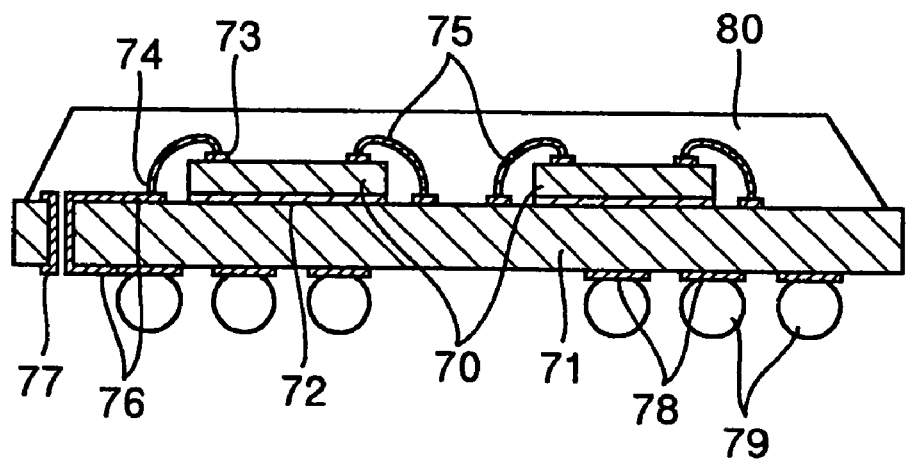
FIG. 12 is a schematic cross sectional view of a multi-chip package in which a plurality of semiconductor chips are mounted.

Further, there is a multi-chip package in which a plurality of semiconductor chips are assembled into one package. An example of the configuration of a multi-chip package is shown in FIG. 12. Semiconductor chips 70 are bonded via a bonding layer 72 to an exclusive board 71 on the side opposite to the side having chip electrodes 73 formed. The chip electrodes 73 and bonding pads 74 on the exclusive board 71 are connected through conductive wires 75 to make an electrical connection between the semiconductor chips 70 and the exclusive board 71. Electrical wiring extends from the bonding pad 74 via a interconnection 76 and a through hole 77 to lands 78, which are formed on the side opposite to the side on which the semiconductor chips 70 are bonded, and external terminals 79 are joined to the lands 78. The semiconductor chips 70 and the wires 75 and the periphery of a joint portion thereof are sealed with a sealing resin 80. FIG. 10 shows an example of a mounting board having a through hole 44 passing through the board, but the wiring may extend to the back side via a plurality of through holes not passing through the board.

The invention can provide a multi-chip module having high reliability against thermal stress or the like.

What is claimed is:

1. A multi-chip module in which a plurality of semiconductor chips having semiconductor elements are mounted on a first surface of a mounting board, wherein at least two of said semiconductor chips include chip electrodes, electrically conductive interconnections to electrically connect with said chip electrodes, electrically conductive lands to electrically connect with said interconnections, first external terminals placed on said lands, and stress-relaxation layers intervening between said lands and said semiconductor chips, said at least two semiconductor chips being placed on said mounting board via said first external terminals, wherein the stress-relaxation layer of a first one of said semiconductor chips is thicker than that of a second one of said semiconductor chips which has a distance between farthest ones of its first external terminals smaller than that of the first semiconductor chip, and wherein said first one of said semiconductor chips includes a tape-like element provided with said electrically conductive lands and said interconnections and located on said stress-relaxation layer, and said interconnections have portions partially protruding from said tape-like element and sealed with a seal resin.

2. A multi-chip module according to claim 1, wherein said second one of said semiconductor chips includes an insulating layer, on which said stress-relaxation layer is located, placed on a main surface of said semiconductor chip, and said interconnections include portions located on slopes of said stress-relaxation layer formed at a side of said chip electrodes.

3. A multi-chip module according to claim 1, wherein said second one of said semiconductor chips includes an insulating layer, on which said stress-relaxation layer is located, placed on a main surface of said semiconductor chip, and said interconnections include portions located on said stress-relaxation layer and portions located on said insulating layer.

4. A multi-chip module according to claim 1, wherein said first and second semiconductor chips comprise GaAs or InP as a main material thereof.

5. A multi-chip module according to claim 1, wherein a distance between an end of said first one of said semiconductor chips and an end of said second one of said semiconductor chips placed adjacent to the first semiconductor chip is less than 1 mm.

6. A multi-chip module in which a plurality of semiconductor chips having semiconductor elements are mounted on a mounting board, wherein at least two of said semiconductor chips include chip electrodes, electrically conductive interconnections to electrically connect with said chip electrodes, electrically conductive lands to electrically connect with said interconnections, external terminals placed on said lands, and stress-relaxation layers intervening between said lands and said semiconductor chips, said at least two semiconductor chips being placed on said mounting board via said external terminals, and wherein the stress-relaxation layer of a first one of the semiconductor chips is thicker than that of a second one of said semiconductor chips which has a diameter of the farthest lands larger than that of the first semiconductor chip, wherein said first one of said semiconductor chips includes a tape-like element provided with said electrically conductive lands and said interconnections and located on said stress-relaxation layer, and said interconnections have portions partially protruding from said tape-like element and sealed with a seal resin.

7. A multi-chip module in which a plurality of semiconductor chips having semiconductor elements are mounted on a mounting board, wherein, at least two of said semiconductor chips include chip electrodes, electrically conductive interconnections to electrically connect with said chip electrodes, electrically conductive lands to electrically connect with said interconnections, external terminals placed on said lands, and stress-relaxation layers intervening between said lands and said semiconductor chips, said at least two semiconductor chips being placed on said mounting board via said external terminals, wherein spaces are provided around said external terminals, wherein a distance between an end of a first one of said semiconductor chips including the stress-relaxation layer and an end of a second one of said semiconductor chips having the stress-relaxation layer placed adjacent to the first semiconductor chip is less than 1 mm, and wherein the stress-relaxation layer of the first semiconductor chip is thicker than that of the second semiconductor chip, wherein said first one of said semiconductor chips includes a tape-like element provided with said electrically conductive lands and said interconnections and located on said stress-relaxation layer, and said interconnections have portions partially protruding from said tape-like element and sealed with a seal resin.

8. A multi-chip module in which a plurality of semiconductor chips having semiconductor elements are mounted on a first surface of a mounting board, wherein at least two of said semiconductor chips have chip electrodes, electrically conductive interconnections to electrically connect with said chip electrodes, electrically conductive lands to electrically connect with said interconnections, first external terminals placed on said lands, and stress-relaxation layers intervening between said lands and said semiconductor chips, said at least two semiconductor chips being placed on said mounting board via said first external terminals, wherein spaces are provided around said first external terminals, wherein a distance between an end of a first one of said semiconductor chips including the stress-relaxation layer and an end of a second one of said semiconductor chips including the stress-relaxation layer placed adjacent to the first semiconductor chip is less than 1 mm, wherein second external terminals to electrically connect with a motherboard are formed on a second surface of the mounting board opposite to the first surface, and wherein the stress-relaxation layer of the first semiconductor chip is thicker than that of the second semiconductor chip, wherein said first one of said semiconductor chips includes a tape-like element provided with said electrically conductive lands and said interconnections and located on said stress-relaxation layer, and said interconnections have portions partially protruding from said tape-like element and sealed with a seal resin.

9. A multi-chip module in which a plurality of semiconductor chips having semiconductor elements are mounted on first surface of a mounting board, wherein at least two of said semiconductor chips include chip electrodes, electrically conductive interconnections to electrically connect with said chip electrodes, electrically conductive lands to electrically connected with said interconnections, external terminals placed on said lands, and stress-relaxation layers respectively intervening between said lands and said semiconductor chips, said at least two semiconductor chips being placed on said mounting board via said external terminals, wherein a first one of said semiconductor chips includes a tape-like element provided with said lands and said interconnections and located on a corresponding one of said stress-relaxation layers, and said interconnections have portions partially protruding from said tape-like element and sealed with a seal resin, wherein a second one of said semiconductor chips comprises an insulating layer, on which a corresponding one of said stress-relaxation layers is located, placed on a main surface of said second semiconductor chip, and said interconnections include portions located on slopes of said corresponding stress-relaxation layer formed at a side of said chip electrodes, and wherein the stress-relaxation layer of said first one of semiconductor chips is thicker than the stress-relaxation layer of said second one of semiconductor chips.

* * * * *